US008134230B2

(12) United States Patent
Yang et al.

(10) Patent No.: US 8,134,230 B2
(45) Date of Patent: Mar. 13, 2012

(54) SEALED JOINT STRUCTURE OF DEVICE AND PROCESS USING THE SAME

(75) Inventors: Tsung-Fu Yang, Hsinchu (TW); Su-Tsai Lu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 354 days.

(21) Appl. No.: 12/508,575

(22) Filed: Jul. 24, 2009

(65) Prior Publication Data
US 2011/0018117 A1  Jan. 27, 2011

(51) Int. Cl.
*H01L 23/48* (2006.01)
(52) U.S. Cl. .................. 257/690; 257/E23.01; 438/118
(58) Field of Classification Search .................. 257/690, 257/704, 737, 778, E23.01, E21.001; 438/106, 438/118
See application file for complete search history.

(56) References Cited

U.S. PATENT DOCUMENTS

| | | | |
|---|---|---|---|
| 5,523,628 A * | 6/1996 | Williams et al. | 257/777 |
| 6,724,084 B1 * | 4/2004 | Hikita et al. | 257/737 |
| 7,164,572 B1 | 1/2007 | Burdon et al. | |
| 7,190,051 B2 | 3/2007 | Mech et al. | |
| 7,228,177 B2 | 6/2007 | Receveur | |

* cited by examiner

*Primary Examiner* — Roy Potter
(74) *Attorney, Agent, or Firm* — Jianq Chyun IP Office

(57) ABSTRACT

A sealed joint structure of device includes a buffer bump layer, conductive joint portions and a sealed joint portion. The buffer bump layer disposed between a device and a substrate includes first parts and a second part surrounding the first parts. Each of the conductive joint portions includes a first electrode covering each of the first parts and a second electrode on the substrate, and each of the first electrodes is electrically connected to the second electrode. The sealed joint portion includes a joint ring located on the substrate and is jointed with the second part to form a hermetic space between the device and the substrate.

30 Claims, 8 Drawing Sheets

SEALED JOINT STRUCTURE OF DEVICE AND PROCESS USING THE SAME

CROSS-REFERENCE TO RELATED APPLICATION

This application claims the priority benefit of Taiwan application serial no. 97151881, filed Dec. 31, 2008. The entirety of the above-mentioned patent application is hereby incorporated by reference herein and made a part of specification.

BACKGROUND

1. Technical Field

The present disclosure is related to a sealed joint structure and particularly to a sealed joint structure and a process using the same, which simultaneously achieve device sealing and packaging.

2. Description of Related Art

A survey of the trend in development of medical electronic products would show that implantable micro package devices and biocompatibility technology have played a very crucial role. If the requirements of biocompatibility and sealing cannot be met, corrosion caused by body fluids, degradation, and intrusion of hazardous substances on the living organism due to damages caused by musculatures all pose great danger and threat for the human body or the animal implanted with a micro package device.

In biomedical electronic package devices using titanium caps, electrodes of the multilayer ceramic substrate are used to transmit signals to the outside. The multilayer ceramic substrate is fabricated by the low-temperature co-fired ceramics (LTCC) technique, where a low-resistance metal such as Au, Ag or Cu is used to fabricate the electrodes, then offset printing is performed to coat circuits, and finally the sintering process is performed at 850° C.-900° C. to form an integrated ceramic device. Afterwards, the integrated ceramic device is placed inside an air-tight hermetic space having a titanium cap so that the sealing process is completed.

During recent years, in order to meet the requirement of miniaturization, the semiconductor integrated circuit process and the package technology are adopted to fabricate all sorts of micro package devices using silicon chips, glass or polymers as the substrate in coordination with the micro-electro-mechanical technology and the biomedical technology to design and fabricate biological and medical detecting devices characterized by miniaturizing, rapid and parallel processing capabilities, e.g., gene chips, protein chips, specimen chips and biological detecting chips. Meanwhile, molecular biology, analytical chemistry, and principles such as biochemical reaction are sufficiently used to rapidly perform a large amount of biochemical detection or reaction in a tiny area.

Moreover, in order for implantable micro package devices, e.g., pacemakers, neuro-stimulators or blood glucose monitors, to prevent hazardous substances from intruding on the living organism, sealing materials and package reliability play a very crucial role in safety.

SUMMARY OF THE INVENTION

The present disclosure provides a sealed joint structure of device to package a device on a substrate. The sealed joint structure of device includes a buffer bump layer, a plurality of conductive joint portions and a sealed joint portion. The buffer bump layer is disposed between the device and the substrate and includes a plurality of first parts and a second part. The second part surrounds the plurality of first parts. The plurality of conductive joint portions are electrically connected between the device and the substrate. Each of the plurality of conductive joint portions includes a first electrode covering each of the plurality of first parts and a second electrode on the substrate. Each of the first electrodes and each of the second electrodes are electrically connected. The sealed joint portion surrounds the plurality of conductive joint portions and includes a joint ring on the substrate. The joint ring is jointed with the second part so as to form a hermetic space between the device and the substrate.

The present disclosure provides a process for forming a sealed joint structure of device. First, a first substrate having a device formed thereon is provided. Afterwards, a buffer layer is formed on the device, and the buffer layer is patterned to form a buffer bump layer including a plurality of first parts and a second part. The second part surrounds the plurality of first parts. Next, a first electrode is formed on each of the plurality of first parts. Thereafter, a second substrate is provided, and a plurality of second electrodes and a joint ring are formed on the second substrate. The joint ring surrounds the plurality of second electrodes. The device is disposed on the second substrate, and each of the first electrodes corresponds and is electrically connected to each of the plurality of second electrodes, and the joint ring is correspondingly jointed with the second part to form a hermetic space between the device and the second substrate.

The present disclosure provides a sealed joint structure of device to package a device on a substrate. The sealed joint structure of device includes a buffer bump layer, a plurality of conductive joint portions and a sealed joint portion. The buffer bump layer is disposed between the device and the substrate; the device has a plurality of pads, and the buffer bump layer has an annular portion surrounding the plurality of pads. The plurality of conductive joint portions are electrically connected between the device and the substrate. Each of the plurality of conductive joint portions includes a metal bump on the device electrically connected to each of the plurality of pads and a second electrode on the substrate. Each of the metal bumps and each of the second electrodes are electrically connected. The sealed joint portion surrounds the plurality of conductive joint portions and includes a joint ring on the substrate. The joint ring is jointed with the annular portion so as to form a hermetic space between the device and the substrate.

The present disclosure provides a process for forming a sealed joint structure of device. First, a first substrate having a device formed thereon is provided. The device has a plurality of pads, and a buffer layer is formed on the device. Then, the buffer layer is patterned to form a buffer bump layer having an annular portion, and the annular portion surrounds the plurality of pads. A plurality of metal bumps are formed on the device, and each of the plurality of metal bumps and each of the plurality of pads are electrically connected. Afterwards, a second substrate is provided, and a plurality of second electrodes and a joint ring are formed on the second substrate. The joint ring surrounds the plurality of second electrodes. The device is disposed on the second substrate, and each of the plurality of metal bumps corresponds and is electrically connected to each of the plurality of second electrodes, and the joint ring is correspondingly jointed with the annular portion to form a hermetic space between the device and the second substrate.

In order to make the aforementioned and other objects, features and advantages of the present disclosure more comprehensible, several embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1A:
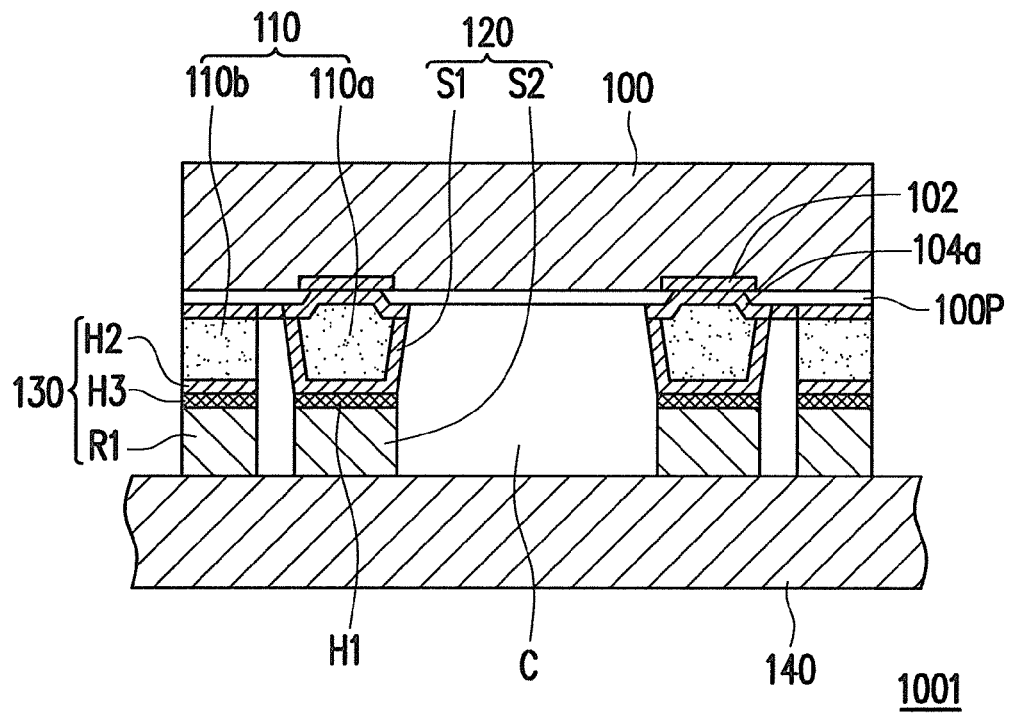
FIGS. 1A and 1B are schematic cross-sectional views of sealed joint structures of device according to two exemplary embodiments of the present disclosure.
Figure 1B:
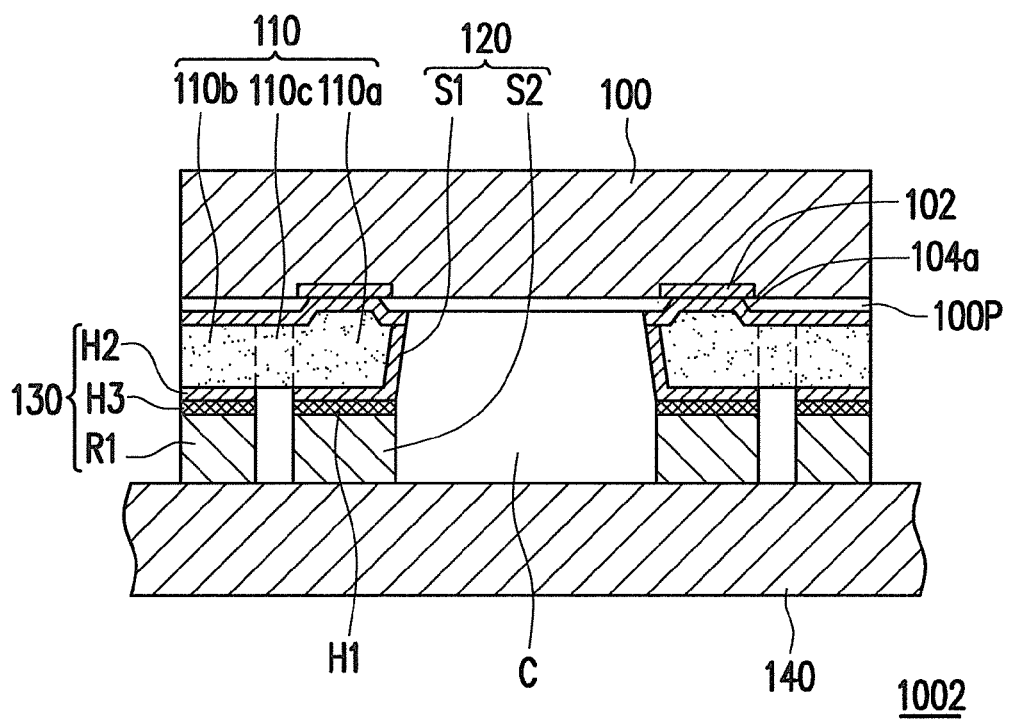

FIGS. 1A and 1B are schematic cross-sectional views of sealed joint structures of device according to two exemplary embodiments of the present disclosure. FIGS. 2A through 2E are a schematic flowchart showing a process for forming the sealed joint structure of device in FIG. 1A.

Referring to FIG. 1A, a sealed joint structure of device 1001 includes a buffer bump layer 110, a plurality of conductive joint portions 120 and a sealed joint portion 130. In the buffer bump layer 110, a patterning process is performed to form a plurality of first parts 110a and a second part 110b (an annular portion) surrounding the plurality of first parts 110a. The material of the buffer bump layer 110 can be a polymer material, e.g. epoxy or polyimide resin. A process of fabricating the buffer bump layer 110 includes coating the polymer material on a substrate (e.g., a silicon wafer) predetermined for a device 100 to be formed thereon. Then, exposure, development or photo-etching and dry etching processes are performed to allow the polymer material to form a predetermined pattern (the plurality of first parts 110a and the second part 110b surrounding the plurality of first parts 110a).

As to the patterning process and a detailed structure of the buffer bump layer 110, please refer to FIGS. 2A through 2D. First, a substrate W is provided, e.g., a semiconductor substrate for forming one or a plurality of integrated circuit devices 100 (only one being shown). The integrated circuit device 100 has an active surface 100S and a passivation layer 100P. Pads 102 (only one being shown) are disposed on the active surface 100S, and the passivation layer 100P covers the active surface 100S and exposes the pads 102. Next, referring to FIGS. 2B and 2C, a sputtering or an evaporation process is performed to form entirely a metal layer 104 on the passivation layer 100P and the pads 102 and further form a buffer material 110' (e.g., a polymer material or a photosensitive polymer material) on the device 100. Thereafter, referring to FIG. 2D, the buffer material 110' is patterned such as by exposure, development, photo-etching or dry etching, so as to form a buffer bump layer 110 including a plurality of first parts 110a (only one being shown) and a second part 110b.

The second part 110b surrounds the plurality of first parts 110a, and thus the second part 110b is an annular bulging structure which completely encircles the plurality of first parts 10a and achieves the buffering and sealing functions simultaneously. Afterwards, referring to FIG. 2E, a first electrode S1 (using Cu, Al or Au as its material) is formed by a sputtering process or an evaporation process on each of the plurality of first parts 10a (e.g., covering a sidewall and an upper surface of one of the plurality of first part 110a). The metal layer 104 is etched to become a under bump metal layer 104a and electrically connected to the first electrode S1 covering each of the plurality of first parts 110a.

According to the present exemplary embodiment, the plurality of first parts 110a and the second part 110b are formed altogether by the same patterning process so as to reduce steps of the process and allow the subsequent sealing process and the device packaging step to proceed at the same time. In addition, an etching process is performed to form a spacing between the plurality of first parts 110a and the second part 110b so that the two parts are separate from each other structurally. However, according to another exemplary embodiment, the plurality of first parts 110a and the second part 110b may be structurally connected with each other and have the buffering and sealing functions likewise.

According to another exemplary embodiment as shown in FIG. 1B, a sealed joint structure of device 1002 includes a buffer bump layer 110, a plurality of conductive joint portions 120 and a sealed joint portion 130. In the buffer bump layer 110, a patterning process is performed to form a plurality of first parts 110a and a second part 110b surrounding the plurality of first parts 110a. Please refer to the steps shown in FIGS. 2A through 2D for the process of forming the buffer bump layer 110. A detailed description of the process is omitted herein. The differences between the present exemplary embodiment and the sealed joint structure of device shown by FIG. 1A and the process shown by FIGS. 2A through 2D lie in that a third part (a connection part) 110c exists between the plurality of first parts 110a and the second part 110b, and the three parts (of the same material) are integrally connected with one another in structure without forming any spacing among the two parts via etching. As a result, the sealing and joint strength is enhanced and the effects of device sealing and packaging are also achieved simultaneously.

Next, referring to FIGS. 1A and 1B, the plurality of conductive joint portion 120 electrically connect the device 100 and the substrate 140 (e.g., a printed circuit board) to input electric signals through the substrate 140 to the device 100 or through the substrate 140 to the outside. Each of the plurality of conductive joint portions 120 includes a first electrode S1 covering each of the plurality of first parts 110a and a second electrode S2 on the substrate 140. Each of the first electrodes S1 and each of the second electrodes S2 are electrically connected through a first adhesive metal layer H1 (NiAu alloy or TiW alloy), for example. Furthermore, the sealed joint portion 130 surrounds the plurality of conductive joint portions 120. The sealed joint portion 130 includes a joint ring R1 (the material thereof being Cu, Al or Au, for example) on the substrate 140 surrounding the second electrodes S2. The joint ring R1 is jointed with the second part 110b to form an air-tight sealed structure through a second adhesive metal layer H2 (NiAu alloy or titanium-tungsten alloy) and a third adhesive metal layer H3 (NiAu alloy or TiW alloy) so that a hermetic space C is formed between the device 100 and the substrate 140.

Figure 2A:
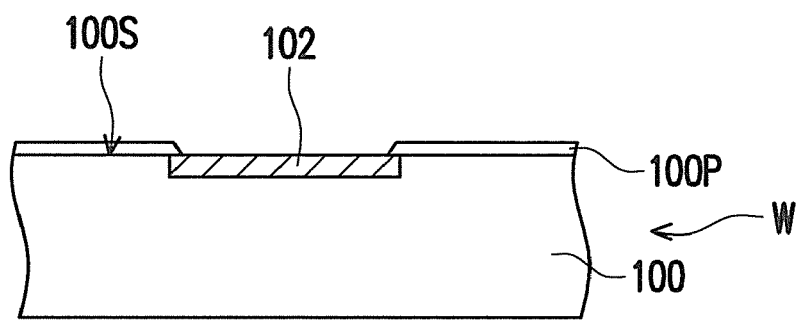
FIGS. 2A through 2E are a schematic flowchart showing a process of forming the sealed joint structure of device in FIG. 1A.
Figure 2B:
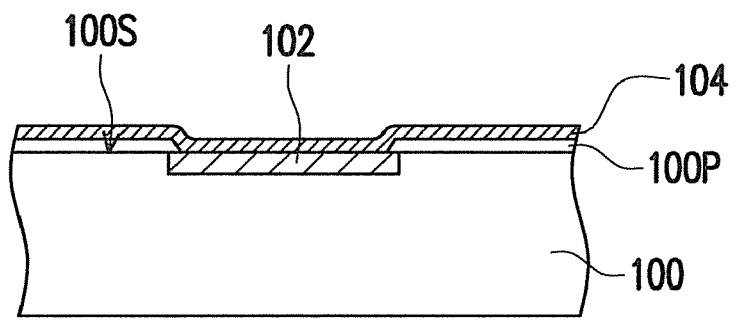
Figure 2C:
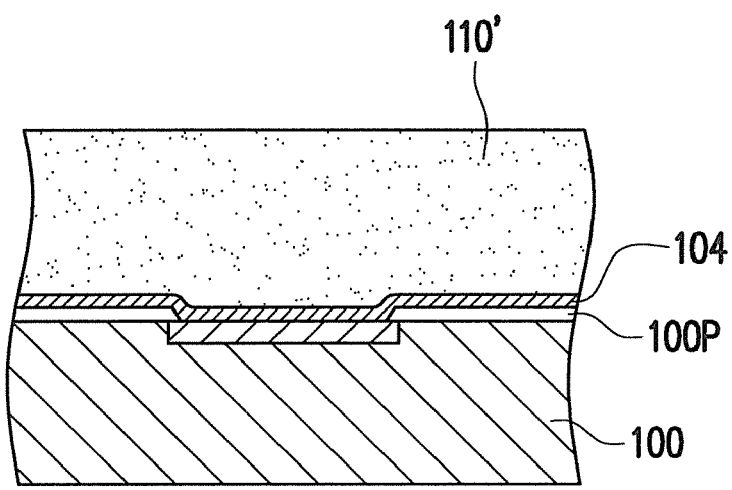
Figure 2D:
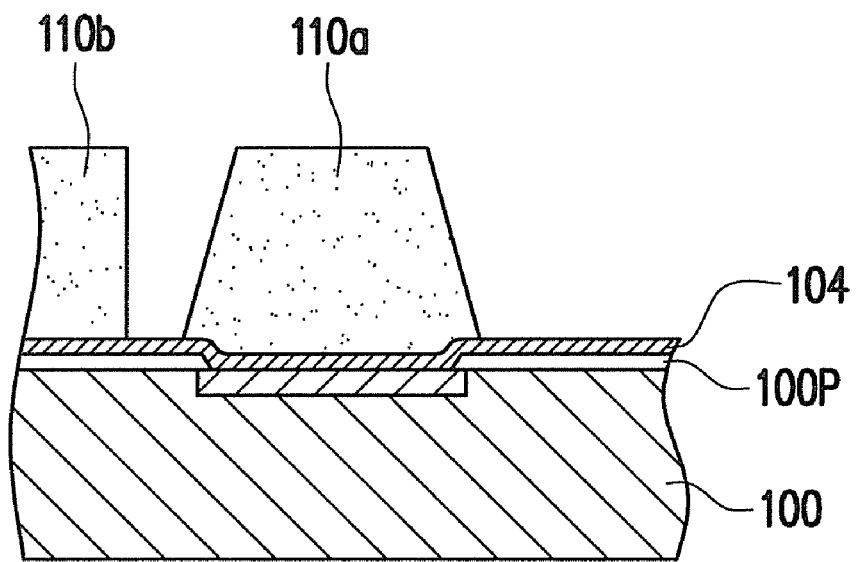
Figure 2E:
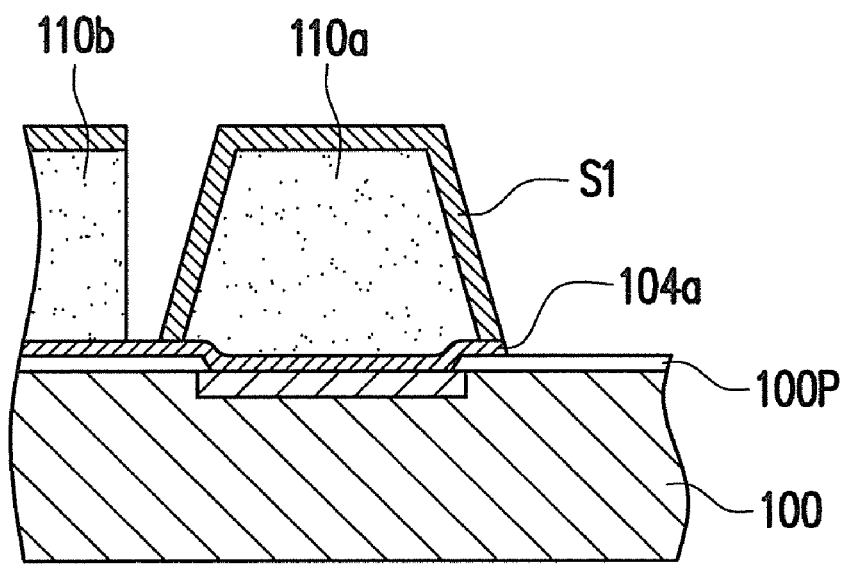

According to the foregoing two exemplary embodiments, the first adhesive metal layer H1 is formed on each of the first electrodes S1, for example, by sputtering or evaporation (see FIG. 2E). The second adhesive metal layer H2, which can be formed in the same step as the first electrode S1, and the third adhesive metal layer H3 are formed on the second part 110b and the joint ring R1 respectively. When the device 100 is disposed on the substrate 140, a thermal compressing process can be further performed to electrically joint each of the first adhesive metal layers H1 between each of the first electrodes S1 and each of the second electrodes S2, and the second adhesive metal layer H2 and the third adhesive metal layer H3 are closely jointed (eutectic bonding) between the joint ring R1 and the second part 110b to enhance the sealing and joint strength. However, the first adhesive metal layer H1, the second adhesive metal layer H2 and the third adhesive metal layer H3 are only exemplary embodiments of the present disclosure and are not intended to limit the present disclosure.

Figure 3A:
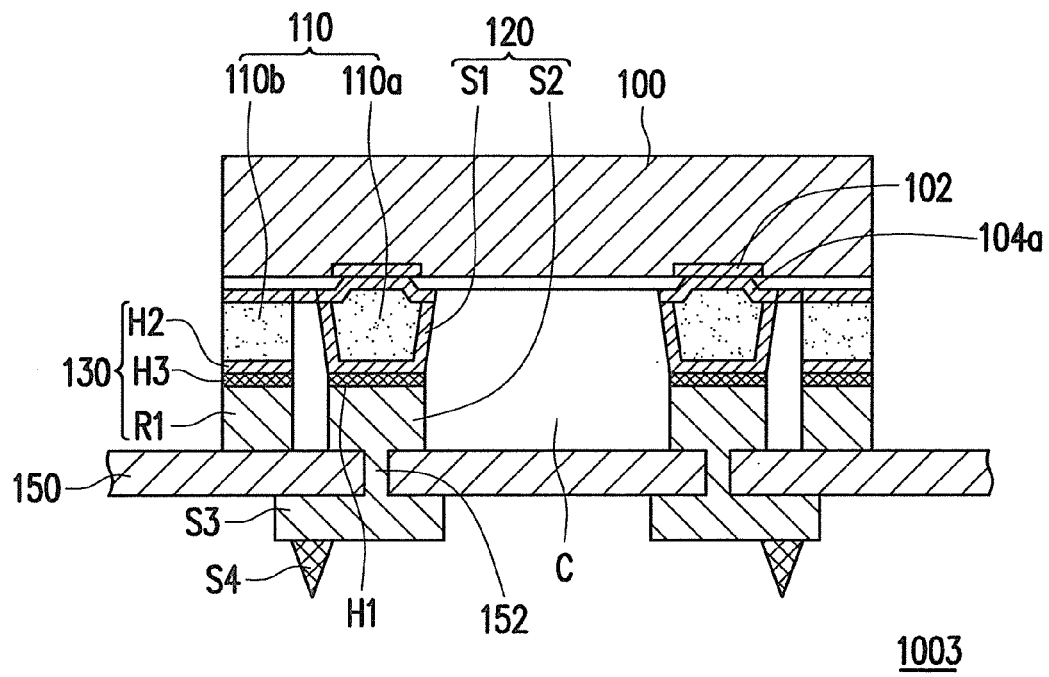
FIGS. 3A and 3B are schematic cross-sectional views of sealed joint structures of device according to another two exemplary embodiments of the present disclosure.
Figure 3B:
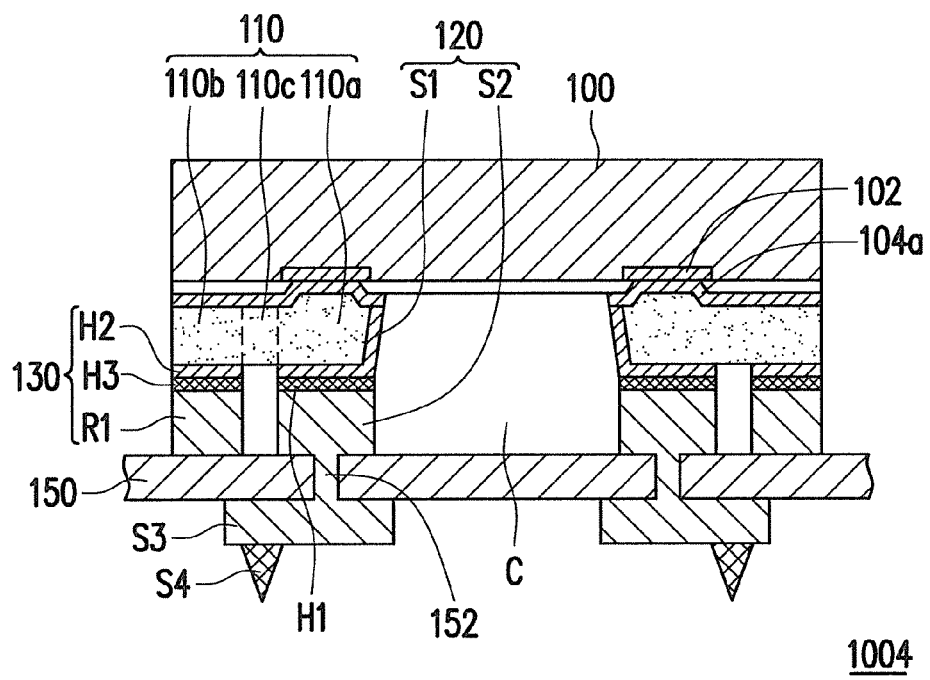

FIGS. 3A and 3B are schematic cross-sectional views of sealed joint structures of device according to another two exemplary embodiments of the present disclosure. Referring to FIGS. 3A and 3B, sealed joint structures of device 1003 and 1004 are used to package a device 100 on a substrate 150 (e.g., a flexible circuit board). A first surface of the substrate 150 has a plurality of second electrodes S2 and a joint ring R1 thereon, and a second surface of the substrate 150 further includes a plurality of third electrodes S3. The plurality of third electrodes S3 are electrically connected to the plurality of second electrodes S2 via plated through holes 152 of the substrate 150. Additionally, each of the plurality of third electrodes S3 further includes a neuro-stimulating electrode S4 (or a conductive paste) thereon for use in transcutaneous electro nerve stimulators (TENS). Each of the neuro-stimulating electrodes S4 can discharge through its tip to provide stimulating current required by electric therapy or muscle restoration.

Figure 4A:
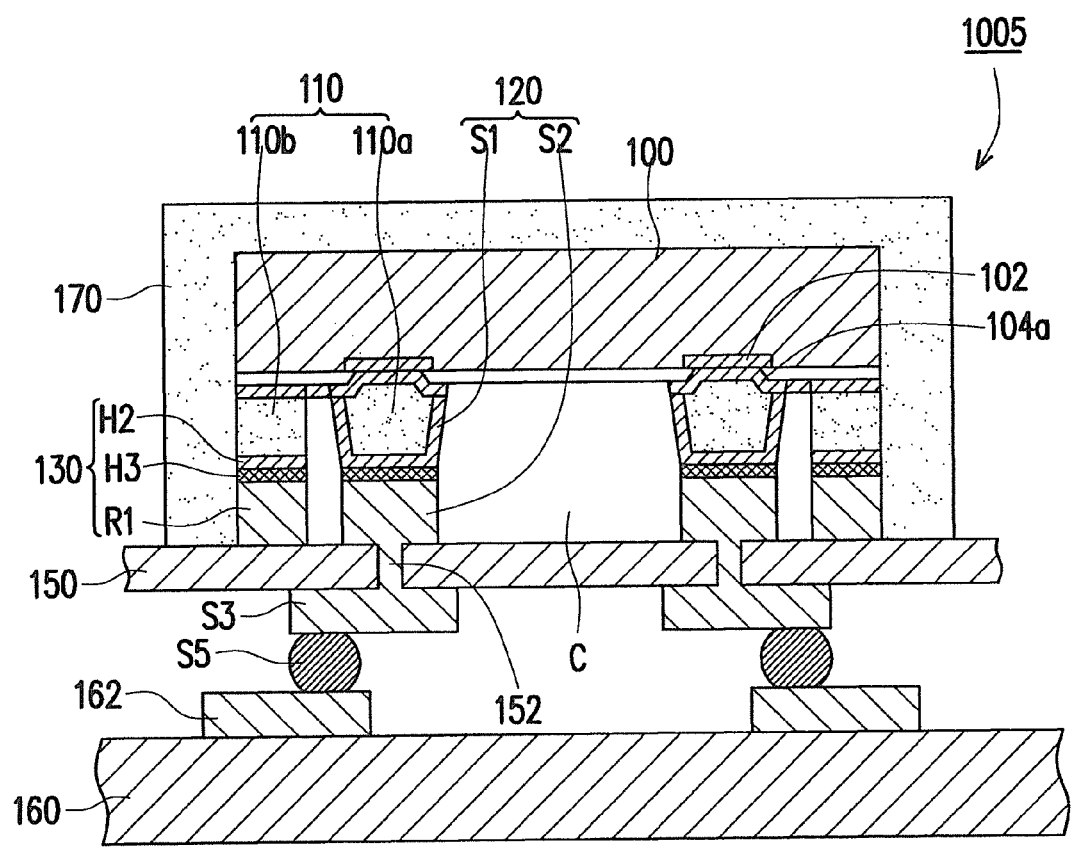
FIGS. 4A and 4B are schematic cross-sectional views of sealed joint structures of device according to another two exemplary embodiments of the present disclosure.
Figure 4B:
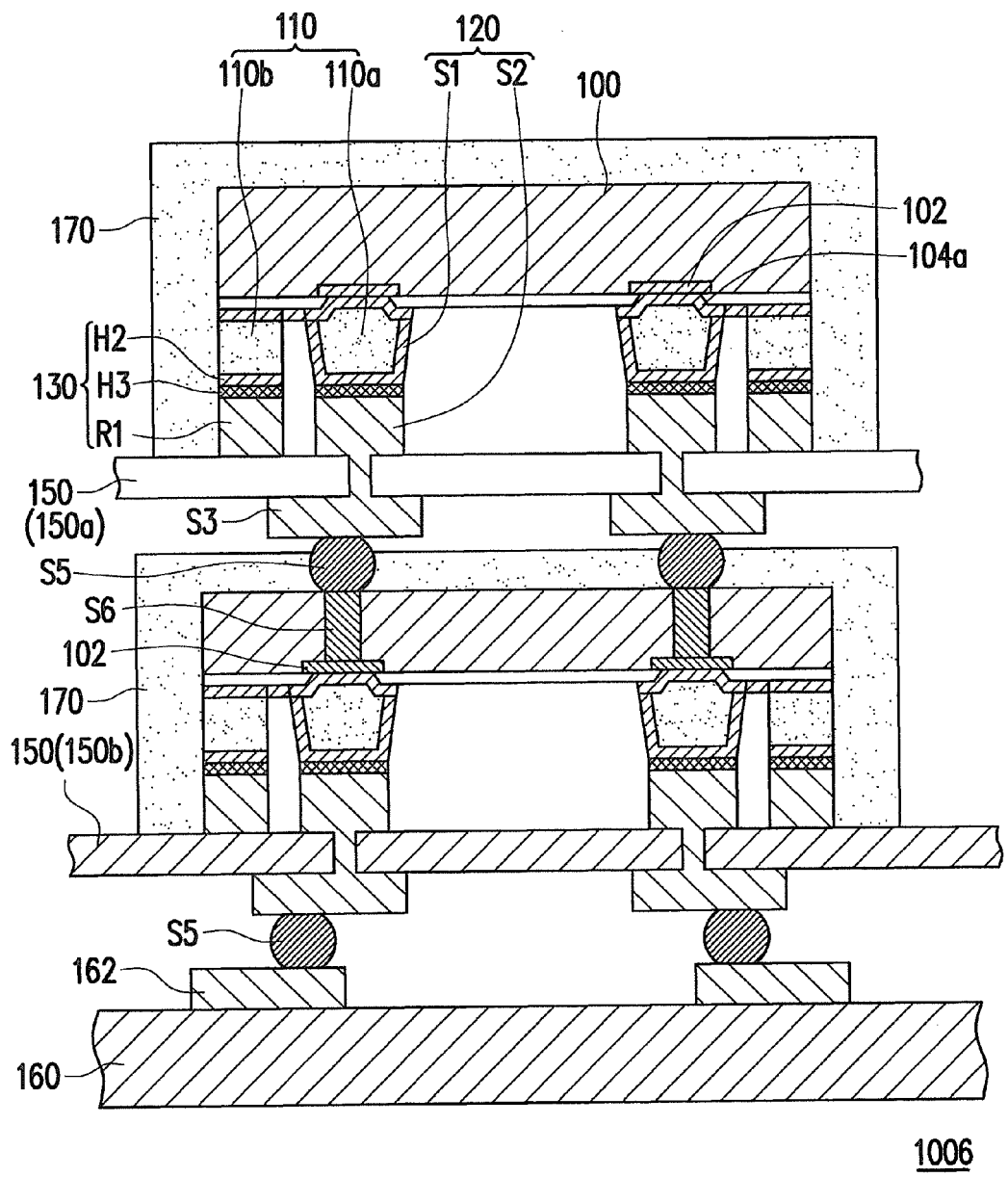

Moreover, FIGS. 4A and 4B are schematic cross-sectional views of sealed joint structures of device according to another two exemplary embodiments of the present disclosure. FIG. 4A is a schematic cross-sectional view of a sealed joint structure of device 1005 having a biocompatible coating 170. FIG. 4B is a schematic cross-sectional view of a stacked package sealed joint structure of device 1006 Referring to FIG. 4A first, taking implantable biomedical devices, e.g., pacemakers, neuro-stimulators or blood glucose monitors, for example, the sealed joint structure of device 1005 packages the device 100 (e.g., a single chip device) on a substrate 150. The substrate 150 can be electrically connected to pads 162 of a carrier 160 through a plurality of conductors S5 (e.g., solder balls) to transmit signals to the exterior of a living organism. The substrate 150 further includes a biocompatible coating 170 thereon (a non-toxic polymer such as silicon) covering the device 100, which not only enhances a coverage ratio and sealing of the device 100, but also does no harm to the tissue of the living organism.

Next, referring to FIG. 4B, the stacked sealed joint structure of device 1006 packages each of the devices 100 (e.g., implantable biomedical devices or single chip devices for other purposes) on each of the substrates 150 to form a stacked multi-chip package device. The first electrode S1 of a first device 100a is electrically connected to the second electrode S2 of a first substrate 150a, and then the third electrode S3 of the first substrate 150a is electrically connected to metal pads 102 of a second device 100b through a plurality of conductors S5 (e.g., solder balls) and a plurality of conductive holes S6 of the second device 100b. Afterwards, the first electrode S1 of the second device 100b is electrically connected to the second electrode S2 of a second substrate 150b, and then the third electrode S3 of the second substrate 150b is electrically connected to the pads 162 of the carrier 160 through the plurality of conductors S5 (e.g., solder balls) so as to transmit signals to the outside. As depicted by FIG. 4A, each of the substrates 150 further includes a biocompatible coating 170 (a non-toxic polymer such as silicon, for example). The biocompatible coating 170 covering each of the devices 100 not only enhances the coverage ratio and sealing of each of the devices 100 but also does no harm to the tissue of the living organism. Certainly, the biocompatible coating 170 can also be replaced by other polymer coating (e.g., epoxy resin), but these examples are not intended to limit the present disclosure in this regard.

Figure 5A:
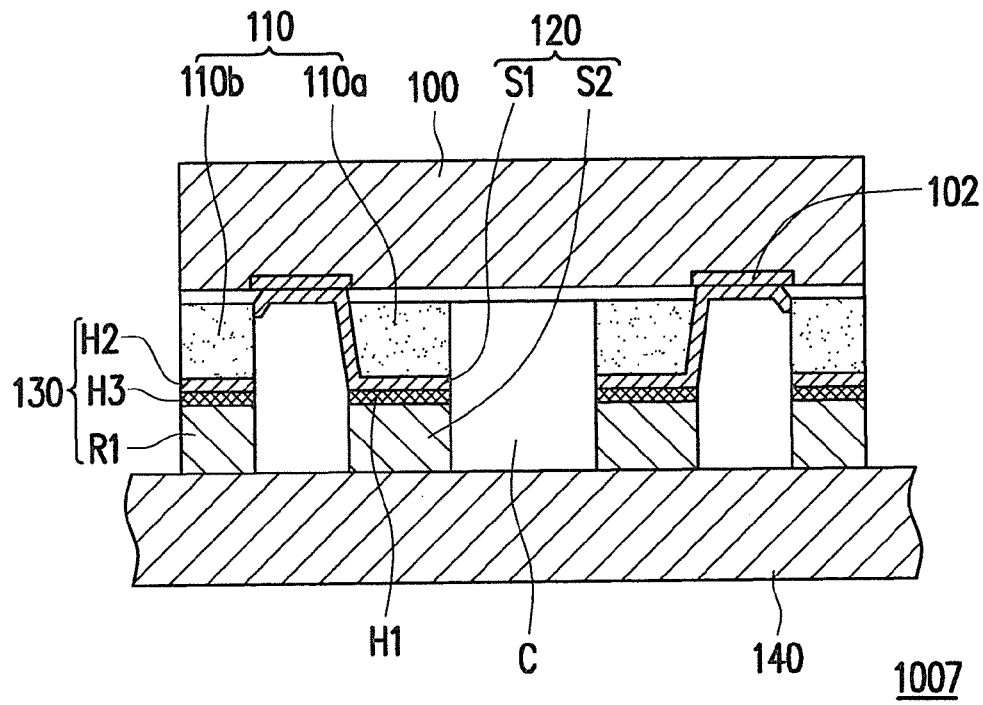
FIGS. 5A and 5B are schematic cross-sectional views of sealed joint structures of device according to another two exemplary embodiments of the present disclosure.
Figure 5B:
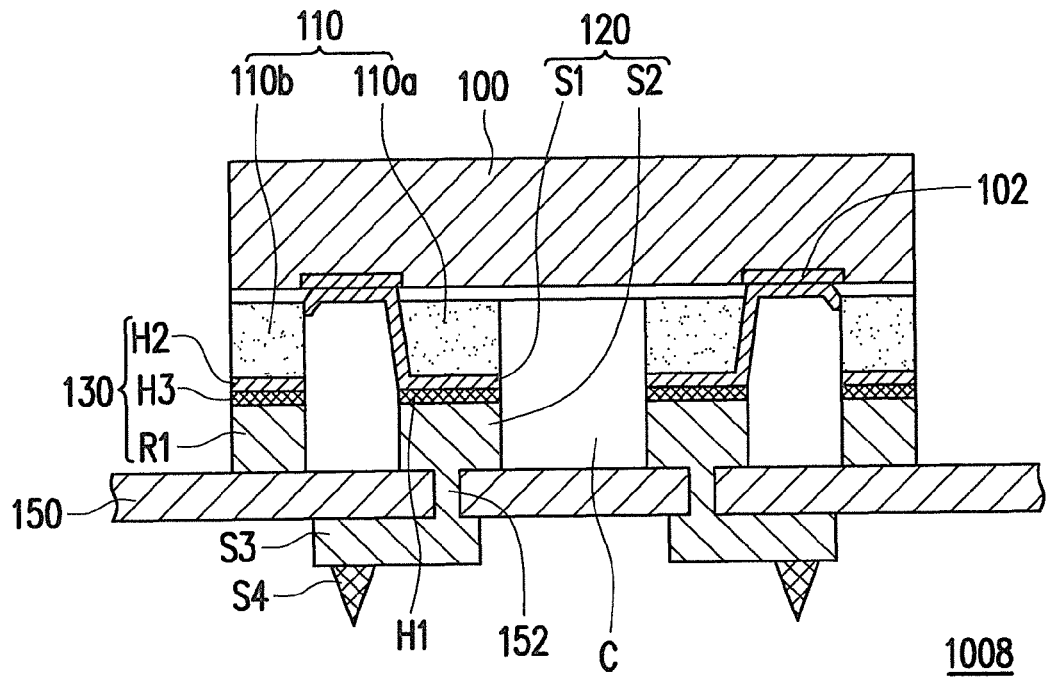

Further, FIGS. 5A and 5B are schematic cross-sectional views of sealed joint structures of device according to another two exemplary embodiments of the present disclosure. Referring to FIGS. 5A and 5B, sealed joint structures of device 1007 and 1008 package a device 100 to a substrate 140 and a substrate 150 respectively. First surfaces of the substrates 140 and 150 have a plurality of second electrodes S2 and a joint ring R1 thereon. Moreover, a second surface of the substrate 150 further includes a plurality of third electrodes S3. Each of the third electrodes S3 is electrically connected to each of the second electrodes S2 via the plated through holes 152 of the substrate 150. Additionally, in FIG. 5B, each of the third electrodes S3 further includes a neuro-stimulating electrode S4 (or a conductive paste) for use in transcutaneous electro nerve stimulators (TENS). Each of the neuro-stimulating electrodes S4 can discharge through its tip to provide stimulating current required by electric therapy or muscle restoration. However, the exemplary embodiment depicted by FIGS. 5A and 5B differs from the foregoing two exemplary embodiments (see FIGS. 1A and 3A) in that the first parts 110a of the buffer bump layer 110 are not formed above the pads 102 through a under bump metal layer 104a, but formed on the passivation layer near the pads 102. Afterwards, the first electrodes S1 are further formed between each of the pads 102 and each of the plurality of first parts 110a (covering a sidewall and an upper surface of each of the pads 102 and each of the plurality of first parts 100a) by sputtering or evaporation. Consequently, each of the pads 102 is electrically connected to each of the second electrodes S2 through each of the first electrodes S1.

The process of forming the buffer bump layer 110 in FIGS. 5A and 5B is similar to the process of forming the buffer bump layer 110 depicted in FIGS. 2D and 2E. The two processes differ in that the process of forming the under bump metal layer 104 depicted in FIG. 2B is omitted, and after patterning the buffer bump layer 110, a first electrode S1 is further formed by sputtering or evaporation to electrically connect each of the pads 102. Hence, the plurality of first parts 110a of the buffer bump layer 110 are not limited to be positioned above the pads 102 and can also extend towards an inner side of the redistributed first electrodes S1 so as to satisfy the requirements of different contact point designs.

Figure 6A:
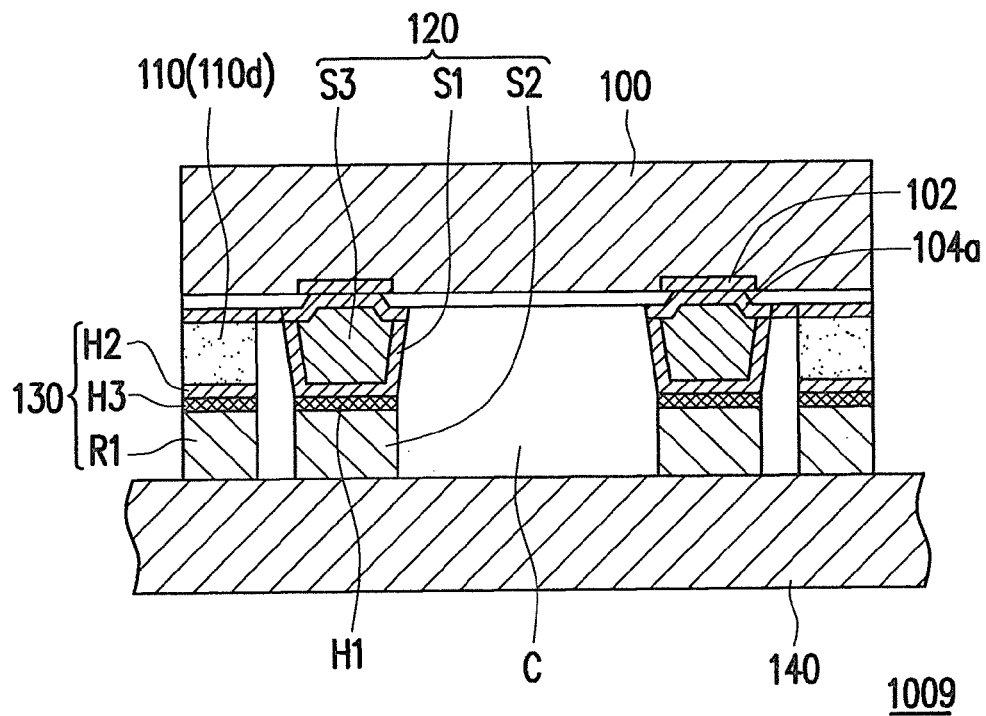
FIGS. 6A and 6B are schematic cross-sectional views of sealed joint structures of device according to another two exemplary embodiments of the present disclosure.
Figure 6B:
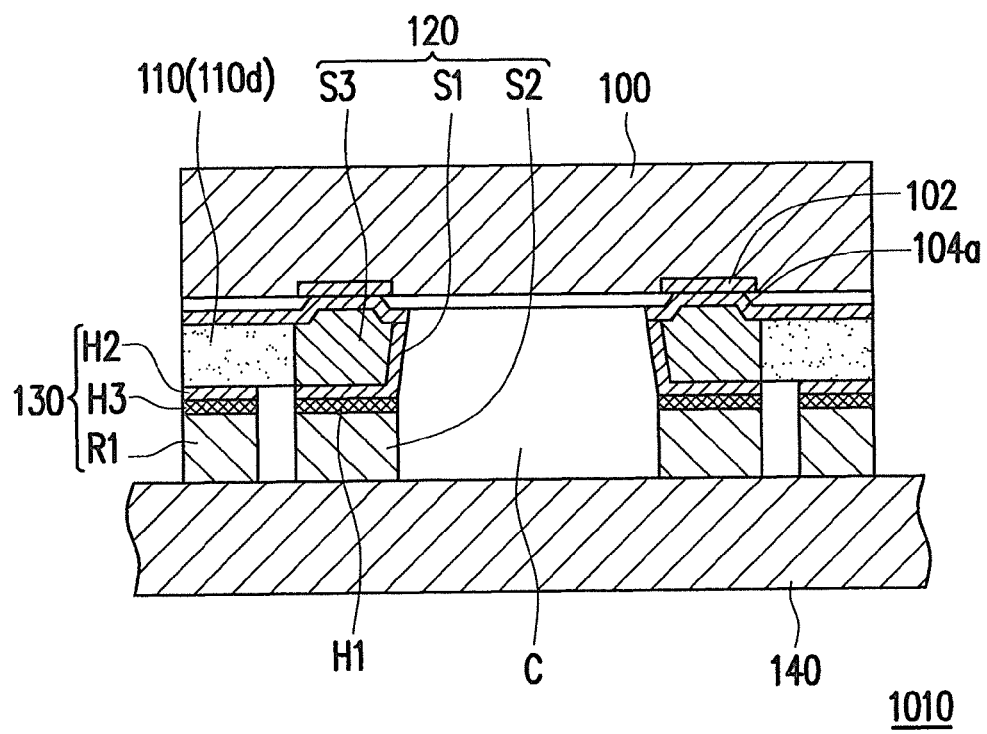

Next, FIGS. 6A and 6B are schematic cross-sectional views of sealed joint structures of device according to another two exemplary embodiments of the present disclosure. Referring to FIGS. 6A and 6B, sealed joint structures of device 1009 and 1010 include a buffer bump layer 110, a plurality of conductive joint portions 120 and a sealed joint portion 130 respectively. In the buffer bump layer 110, a polymer material is used to fabricate an annular portion 110d (see FIG. 6B), and a conductive material is used to fabricate a plurality of metal bumps S3 (in replacement of the original first parts 110a). The metal bumps S3 can be electrically connected to each of the pads 102 through the under bump metal layer 104a so that the first electrodes S1, the metal bumps S3 and the second electrodes S2 constitute a conductive joint portion 120 having an electric connecting function. The annular portion 110d surrounding the metal bumps S3 is jointed with the sealed joint portion 130 and has a sealing and a buffering functions such that a hermetic space C is formed between the device 100 and the substrate 140.

The process of forming the metal bumps S3 in FIGS. 6A and 6B is similar to that of forming the buffer bump layer 110 depicted by FIGS. 2D and 2E. The two processes differ in that the metal bumps S3 are formed on the pads 102 by electroplating, and after forming the metal bumps S3, a first electrode S1 is formed by sputtering or evaporation to cover each of the metal bumps S3.

According to the present exemplary embodiment, when the material of the metal bump S3 is gold, the metal bumps S3 can be electrically connected to the second electrodes S2 directly through the first adhesive metal layer H1, and the first electrodes S1 are not required to be formed first on the metal bumps S3. In addition, when the material of the metal bump S3 is Cu or Cu alloy, the first electrode S1 on the metal bump S3 can be used as an oxidation-resistant layer (e.g., a Ni/Au layer) to avoid oxidation on the surface of Cu.

In summary, the present disclosure provides a plurality of sealed joint structures of device and processes using the same, which are suitable for application in all sorts of micro package devices, e.g., gene chips, protein chips, specimen chips, biological detecting chips or implantable biomedical devices. Use of the buffer bump layer not only strengthens the sealing and joint strength but also achieves the purposes of sealing and packaging devices so as to prevent hazardous substances from intruding on the living organism. Besides, the buffer bump layer is fabricated by a single patterning process, and no extra masks and additional mask processes are required to be fabricated and performed. Consequently, the number of steps in the process are reduced, and the subsequent sealing process and package steps for device are performed simultaneously to thereby simplify the sealing and packaging processes and reduce fabrication costs. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A sealed joint structure of device, for packaging a device on a substrate, the sealed joint structure of device comprising:
    a buffer bump layer, disposed between the device and the substrate, the buffer bump layer comprising a plurality of first parts and a second part, the second part surrounding the plurality of first parts;
    a plurality of conductive joint portions, electrically connected between the device and the substrate, wherein each of the plurality of conductive joint portions comprises a first electrode covering each of the plurality of first parts and a second electrode on the substrate, materials of the first electrodes and the first parts are different, and each of the first electrodes and each of the second electrodes are electrically connected; and
    a sealed joint portion, disposed on the substrate and surrounding the plurality of conductive joint portions, the sealed joint portion being jointed with the second part so as to form a hermetic space between the device and the substrate.

2. The sealed joint structure of device as claimed in claim 1, wherein the first parts and the second part have a spacing therebetween and are separate from each other structurally.

3. The sealed joint structure of device as claimed in claim 1, wherein the first parts and the second part have a third part therebetween and are connected with each other structurally.

4. The sealed joint structure of device as claimed in claim 1, wherein a material of the buffer bump layer comprises a polymer material.

5. The sealed joint structure of device as claimed in claim 1, further comprising a first adhesive metal layer between each of the first electrodes and each of the second electrodes.

6. The sealed joint structure of device as claimed in claim 1, further comprising a second adhesive metal layer and a third adhesive metal layer between the joint ring and the second part.

7. The sealed joint structure of device as claimed in claim 1, wherein the substrate further comprises a plurality of third electrodes, and the plurality of third electrodes are electrically connected to the second electrodes respectively through the substrate.

8. The sealed joint structure of device as claimed in claim 7, wherein each of the plurality of third electrodes further comprises a neuro-stimulating electrode thereon.

9. The sealed joint structure of device as claimed in claim 1, wherein the substrate further comprises a biocompatible coating to cover the device.

10. The sealed joint structure of device as claimed in claim 1, wherein the device has a plurality of pads, and each of the plurality of first parts is disposed on each of the plurality of pads through a under bump metal layer, the under bump metal layer being electrically connected to the first electrode covering each of the plurality of first parts.

11. The sealed joint structure of device as claimed in claim 1, wherein the device has a plurality of pads, and the first electrode is formed between each of the plurality of pads and each of the plurality of first parts, each of the plurality of pads being electrically connected to each of the second electrodes through each of the first electrodes.

12. A process for forming a sealed joint structure of device, comprising:
    providing a first substrate having a device formed thereon;
    forming a buffer layer on the device;
    patterning the buffer layer to form a buffer bump layer comprising a plurality of first parts and a second part, wherein the second part surrounds the plurality of first parts;
    forming a first electrode on each of the plurality of first parts, wherein materials of the first electrodes and the first parts are different;
    providing a second substrate, having a plurality of second electrodes and a sealed joint portion formed on the substrate, the sealed joint portion surrounding the plurality of second electrodes; and
    disposing the device on the second substrate, wherein each of the first electrodes corresponds and is electrically connected to each of the plurality of second electrodes, and the sealed joint portion is correspondingly jointed with the second part to form a hermetic space between the device and the second substrate.

13. The process as claimed in claim 12, wherein during patterning the buffer layer, the plurality of first parts and the second part have a spacing formed therebetween after etching, and the plurality of first parts and the second part are separate from each other structurally.

14. The process as claimed in claim 12, wherein during patterning the buffer layer, the plurality of first parts and the second part have a third part formed therebetween respectively, and the plurality of first parts, the second part and the third part are connected with one another structurally.

15. The process as claimed in claim 12, after forming the first electrode in each of the plurality of first parts, further comprising:
    forming a first adhesive metal layer on each of the first electrodes;
    forming a second adhesive metal layer on the second part;
    forming a third adhesive metal layer on the joint ring; and
    when disposing the device on the second substrate, further performing a thermal compressing process to render each of the first adhesive metal layer electrically jointed between each of the first electrodes and each of the plurality of second electrodes, the second adhesive metal layer and the third adhesive metal layer being jointed between the joint ring and the second part.

16. The process as claimed in claim 12, wherein during providing the second substrate, the second substrate further comprises a plurality of third electrodes, and the plurality of third electrodes are electrically connected to the plurality of second electrodes respectively through the second substrate.

17. The process as claimed in claim 12, wherein disposing the device on the second substrate further comprises forming a biocompatible coating covering the device.

18. A sealed joint structure of device, for packaging a device on a substrate, the sealed joint structure of device comprising:
    a buffer bump layer, disposed between the device and the substrate, the device having a plurality of pads, the buffer bump layer having an outer portion surrounding the plurality of pads;
    a plurality of conductive joint portions, electrically connected between the device and the substrate, wherein each of the plurality of conductive joint portions comprises a metal bump on the device electrically connected to each of the plurality of pads and a second electrode on the substrate, and each of the metal bumps each of the second electrodes are electrically connected, and materials of the metal bumps and the buffer bump layer are different; and
    a sealed joint portion, disposed on the substrate, surrounding the plurality of conductive joint portions, and being jointed with the outer portion so as to form a hermetic space between the device and the substrate.

19. The sealed joint structure of device as claimed in claim 18, wherein the material of the buffer bump layer comprises a polymer material.

20. A sealed joint structure of device, for packaging a device on a substrate, the sealed joint structure of device comprising:
    a buffer bump layer, disposed between the device and the substrate, the device having a plurality of pads, the buffer bump layer having an outer portion surrounding the plurality of pads;
    a plurality of conductive joint portions, electrically connected between the device and the substrate, wherein each of the plurality of conductive joint portions comprises a metal bump on the device electrically connected to each of the plurality of pads and a second electrode on the substrate, and each of the metal bumps each of the second electrodes are electrically connected, and materials of the metal bumps and the buffer bump layer are different;
    a sealed joint portion, disposed on the substrate, surrounding the plurality of conductive joint portions, and being jointed with the outer portion so as to form a hermetic space between the device and the substrate; and
    a first adhesive metal layer between each of the metal bumps and each of the second electrodes.

21. A sealed joint structure of device, for packaging a device on a substrate, the sealed joint structure of device comprising:
    a buffer bump layer, disposed between the device and the substrate, the device having a plurality of pads, the buffer bump layer having an outer portion surrounding the plurality of pads;
    a plurality of conductive joint portions, electrically connected between the device and the substrate, wherein each of the plurality of conductive joint portions comprises a metal bump on the device electrically connected to each of the plurality of pads and a second electrode on the substrate, and each of the metal bumps each of the second electrodes are electrically connected, and materials of the metal bumps and the buffer bump layer are different;
    a sealed joint portion, disposed on the substrate, surrounding the plurality of conductive joint portions, and being jointed with the outer portion so as to form a hermetic space between the device and the substrate; and
    a second adhesive metal layer and a third adhesive metal layer between the joint ring and the annular portion.

22. A sealed joint structure of device, for packaging a device on a substrate, the sealed joint structure of device comprising:
    a buffer bump layer, disposed between the device and the substrate, the device having a plurality of pads, the buffer bump layer having an outer portion surrounding the plurality of pads;
    a plurality of conductive joint portions, electrically connected between the device and the substrate, wherein each of the plurality of conductive joint portions comprises a metal bump on the device electrically connected to each of the plurality of pads and a second electrode on the substrate, and each of the metal bumps each of the second electrodes are electrically connected, and materials of the metal bumps and the buffer bump layer are different; and
    a sealed joint portion, disposed on the substrate, surrounding the plurality of conductive joint portions, and being jointed with the outer portion so as to form a hermetic space between the device and the substrate;
    wherein the substrate further comprises a plurality of third electrodes, and the plurality of third electrodes are electrically connected to the second electrodes through the substrate respectively.

23. A sealed joint structure of device, for packaging a device on a substrate, the sealed joint structure of device comprising:
    a buffer bump layer, disposed between the device and the substrate, the device having a plurality of pads, the buffer bump layer having an outer portion surrounding the plurality of pads;
    a plurality of conductive joint portions, electrically connected between the device and the substrate, wherein each of the plurality of conductive joint portions comprises a metal bump on the device electrically connected to each of the plurality of pads and a second electrode on the substrate, and each of the metal bumps each of the second electrodes are electrically connected, and materials of the metal bumps and the buffer bump layer are different; and a sealed joint portion, disposed on the substrate, surrounding the plurality of conductive joint portions, and being jointed with the outer portion so as to form a hermetic space between the device and the substrate;

wherein the substrate further comprises a plurality of third electrodes, and the plurality of third electrodes are electrically connected to the second electrodes through the substrate respectively;

wherein each of the plurality of third electrodes further comprises a neuro-stimulating electrode thereon.

24. A sealed joint structure of device, for packaging a device on a substrate, the sealed joint structure of device comprising:

a buffer bump layer, disposed between the device and the substrate, the device having a plurality of pads, the buffer bump layer having an outer portion surrounding the plurality of pads;

a plurality of conductive joint portions, electrically connected between the device and the substrate, wherein each of the plurality of conductive joint portions comprises a metal bump on the device electrically connected to each of the plurality of pads and a second electrode on the substrate, and each of the metal bumps each of the second electrodes are electrically connected, and materials of the metal bumps and the buffer bump layer are different; and a sealed joint portion, disposed on the substrate, surrounding the plurality of conductive joint portions, and being jointed with the outer portion so as to form a hermetic space between the device and the substrate;

wherein the substrate further comprises a biocompatible coating to cover the device.

25. A sealed joint structure of device, for packaging a device on a substrate, the sealed joint structure of device comprising:

a buffer bump layer, disposed between the device and the substrate, the device having a plurality of pads, the buffer bump layer having an outer portion surrounding the plurality of pads;

a plurality of conductive joint portions, electrically connected between the device and the substrate, wherein each of the plurality of conductive joint portions comprises a metal bump on the device electrically connected to each of the plurality of pads and a second electrode on the substrate, and each of the metal bumps each of the second electrodes are electrically connected, and materials of the metal bumps and the buffer bump layer are different; and a sealed joint portion, disposed on the substrate, surrounding the plurality of conductive joint portions, and being jointed with the outer portion so as to form a hermetic space between the device and the substrate;

wherein each of the metal bumps is disposed on each of the plurality of pads through a under bump metal layer, the under bump metal layer being electrically connected to a first electrode covering each of the metal bumps.

26. A process for forming a sealed joint structure of device, comprising:

providing a first substrate having a device formed thereon, the device having a plurality of pads;

forming a buffer layer on the device;

patterning the buffer layer to form a buffer bump layer having an outer portion, wherein the outer portion surrounds the plurality of pads;

forming a plurality of metal bumps on the device, each of the plurality of metal bumps being electrically connected to each of the plurality of pads, wherein materials of the metal bumps and the buffer bump layer are different;

providing a second substrate, having a plurality of second electrodes and a sealed joint portion formed on the second substrate, the sealed joint portion surrounding the plurality of second electrodes; and disposing the device on the substrate, wherein each of the plurality of metal bumps corresponds and is electrically connected to each of the plurality of second electrodes, and the sealed joint portion is correspondingly jointed with the outer portion to form a hermetic space between the device and the second substrate.

27. The process as claimed in claim 26, after forming the plurality of metal bumps on the device, further comprising:

forming a first adhesive metal layer on each of the plurality of metal bumps;

forming a second adhesive metal layer on the annular portion;

forming a third adhesive metal layer on the joint ring; and when disposing the device on the second substrate, further performing a thermal compressing process to render each of the first adhesive metal layers electrically jointed between each of the plurality of metal bumps and each of the plurality of second electrodes, the second adhesive metal layer and the third adhesive metal layer being jointed between the joint ring and the annular portion.

28. The process as claimed in claim 26, wherein during providing the second substrate, the second substrate further comprises a plurality of third electrodes, and the plurality of third electrodes are electrically connected to the plurality of second electrodes respectively through the second substrate.

29. The process as claimed in claim 26, wherein disposing the device on the second substrate further comprises forming a biocompatible coating covering the device.

30. The sealed joint structure of device as claimed in claim 1, wherein the material of the first parts comprises a non metal material, and the material of the first electrode comprises a metal material.

* * * * *